Jan. 11, 1966 V. A. VULCAN 3,228,862

ESAKI DIODE MANUFACTURING PROCESS, AND APPARATUS

Filed Oct. 4, 1960 4 Sheets-Sheet 1

INVENTOR.
VICTOR A. VULCAN

Jan. 11, 1966 V. A. VULCAN 3,228,862

ESAKI DIODE MANUFACTURING PROCESS, AND APPARATUS

Filed Oct. 4, 1960 4 Sheets-Sheet 2

INVENTOR.
VICTOR A. VULCAN

Jan. 11, 1966 V. A. VULCAN 3,228,862

ESAKI DIODE MANUFACTURING PROCESS, AND APPARATUS

Filed Oct. 4, 1960 4 Sheets-Sheet 3

INVENTOR.
VICTOR A. VULCAN

INVENTOR.
VICTOR A. VULCAN

United States Patent Office 3,228,862
Patented Jan. 11, 1966

3,228,862

ESAKI DIODE MANUFACTURING PROCESS, AND APPARATUS

Victor A. Vulcan, Brooklyn, N.Y., assignor to General Instrument Corporation, Newark, N.J., a corporation of New Jersey Filed Oct. 4, 1960, Ser. No. 60,427
7 Claims. (Cl. 204—143)

The present invention relates to the art of manufacturing Esaki diodes, sometimes known as tunnel diodes, and apparatus therefor; more particularly the invention relates to processes and apparatus whereby Esaki diodes may be etched to accurately determine the peak current characteristic of the diodes.

Manufacture of Esaki diodes is usually accomplished by preparation of a p-n junction having an impurity level within a particular predetermined range, securing electrical contacts to the diode and etching the p-n junction to reduce its area as may be necessary to provide an Esaki diode having the desired peak current characteristic.

The present invention relates to the last mentioned step described above, and as the preliminary steps in the manufacture of Esaki diodes are well known, no further description of these preliminary steps will be presented here.

Previously known methods of electrolytic etching to determine the peak current characteristic have involved etching in potassium hydroxide (KOH) solution for a predetermined time interval, measurement of the peak current of the diode being etched together with further alternate etching and measurement steps until the desired peak current level characteristic was produced, or in some cases, more classification of the diodes according to peak current characteristic ranges.

As can readily be appreciated previous methods were time consuming and expensive and did not provide means for accurately determining and controlling peak current characteristics.

The method and apparatus of the present invention etches Esaki diodes at a controllable preset etching rate until the peak current characteristic is within approximately 5% of a predetermined desired level (within the range of 1 to 25 milliamps with the specific apparatus disclosed); the etching process is then discontinued and a suitable indication is given that the finished diode may be removed from the etching apparatus, making it available to process another raw diode. The method and apparatus lends itself to processing many diodes at the same time utilizing apparatus with numerous separate etching control circuits. The same solution can be utilized for the numerous simultaneous etching operations thereby greatly reducing the bulk of the apparatus. A single attendant can supervise the processing of as many diodes as he can conveniently remove and replace in the etching solution as each diode is completed. Automatic equipment can be utilized to place the raw diodes at the etching stations and remove the processed diodes if it should be economically feasible to do so.

In addition to providing diodes with accurately predetermined peak current characteristics over a wide range of peak current levels the present invention provides a method and apparatus for processing diodes which show desirable etch contours, high peak current-to-valley current ratios, and low series resistances.

In addition to the previously described features and advantages, it is an object of the present invention to provide a process and apparatus for etching Esaki diodes to obtain a desired peak current characteristic wherein the diode while in the etching solution is rapidly and alternately subjected to etching current and sensing current, and wherein the etching current is discontinued when it has been indicated by a parameter of the sensing signal that the desired peak current characteristic has been obtained.

It is another object of the present invention to provide a process and apparatus for etching Esaki diodes to obtain a desired peak current characteristic wherein the Esaki diode is subjected to etching current for a short interval, is thereafter subjected to a signal to place it in the low voltage portion of its operating characteristic and is then subjected to a current of a level equal to a desired peak current level, and wherein this operation is repeated until the predetermined current level causes the diode to switch from its low voltage characteristic portion to its high voltage characteristic portion, which switching action is sensed and the etching operation is discontinued.

It is still another object of the present invention to provide a process and apparatus for the etching of Esaki diodes to obtain a desired peak current characteristic wherein the peak current characteristic is determined by causing a current to flow through the diode equal to the desired peak current level and the voltage across the diode at this current level is evaluated to determine whether it is in the high voltage portion or the low voltage portion of the diode characteristic.

It is a still further object of the present invention to provide a process and apparatus of the foregoing type wherein the voltage sensing or detecting circuit is rendered inoperative during the etching operation by means of a detection inhibiting gate in series with an electrode of an element in the detecting circuit, said gate comprising one or more Esaki diodes which, when an inhibiting signal is supplied through the Esaki diodes, will produce an inhibiting voltage and a relatively high resistance, while in the absence of such an inhibiting signal the diodes will present relatively little resistance or voltage drop.

Other objects and advantages will be apparent from a consideration of the following description in conjunction with the appended drawings in which FIG. 1 is a schematic block diagram of apparatus for etching Esaki diodes according to the present invention;

In view of the fact that Esaki diodes are a relatively recent development in the electronic art and since such diodes enter into the present invention both as an article of manufacture and as a component in the manufacturing apparatus, it will be helpful to present a brief explanation of the nature of such Esaki diodes.

Figure 5:
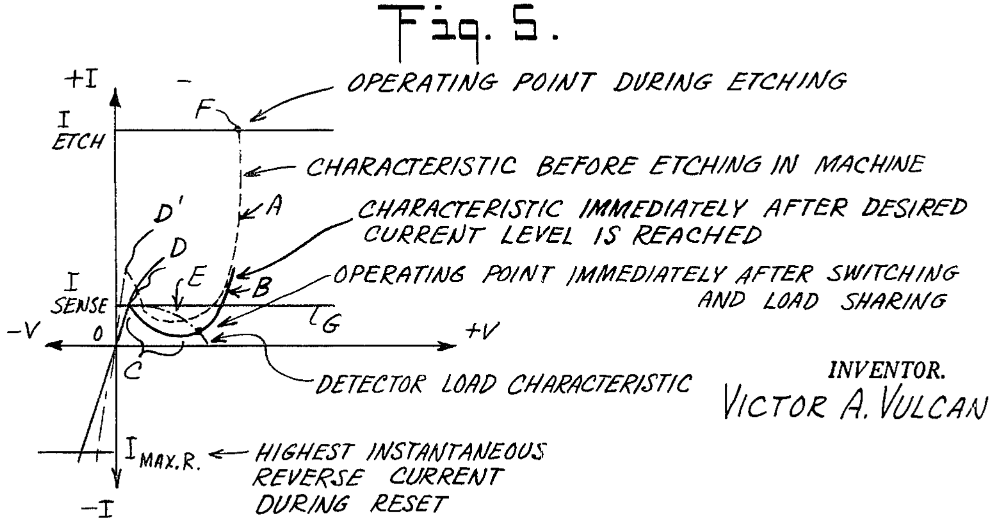
FIG. 5 is a graph of exemplary operating characteristics of Esaki diodes presented to aid in the explanation of the present invention.

FIGURE 5 shows the voltage-current characteristics of an Esaki diode and will be utilized later in the explanation of the operation of the present process and apparatus. The solid line B in FIGURE 5 shows an Esaki diode characteristic which will be noted to have a region C wherein an increasing voltage results in a decreasing current and vice versa. This characteristic of the Esaki diode is principally responsible for its usefulness and is sometimes termed negative resistance.

In the explanation of the present invention, it will be understood that the apparatus and method described by way of example are intended primarily for use in the production of germanium Esaki diodes. However, the process and apparatus may also be utilized for the production of Esaki diodes of some other type, gallium arsenide Esaki diodes for example.

Figure 1:
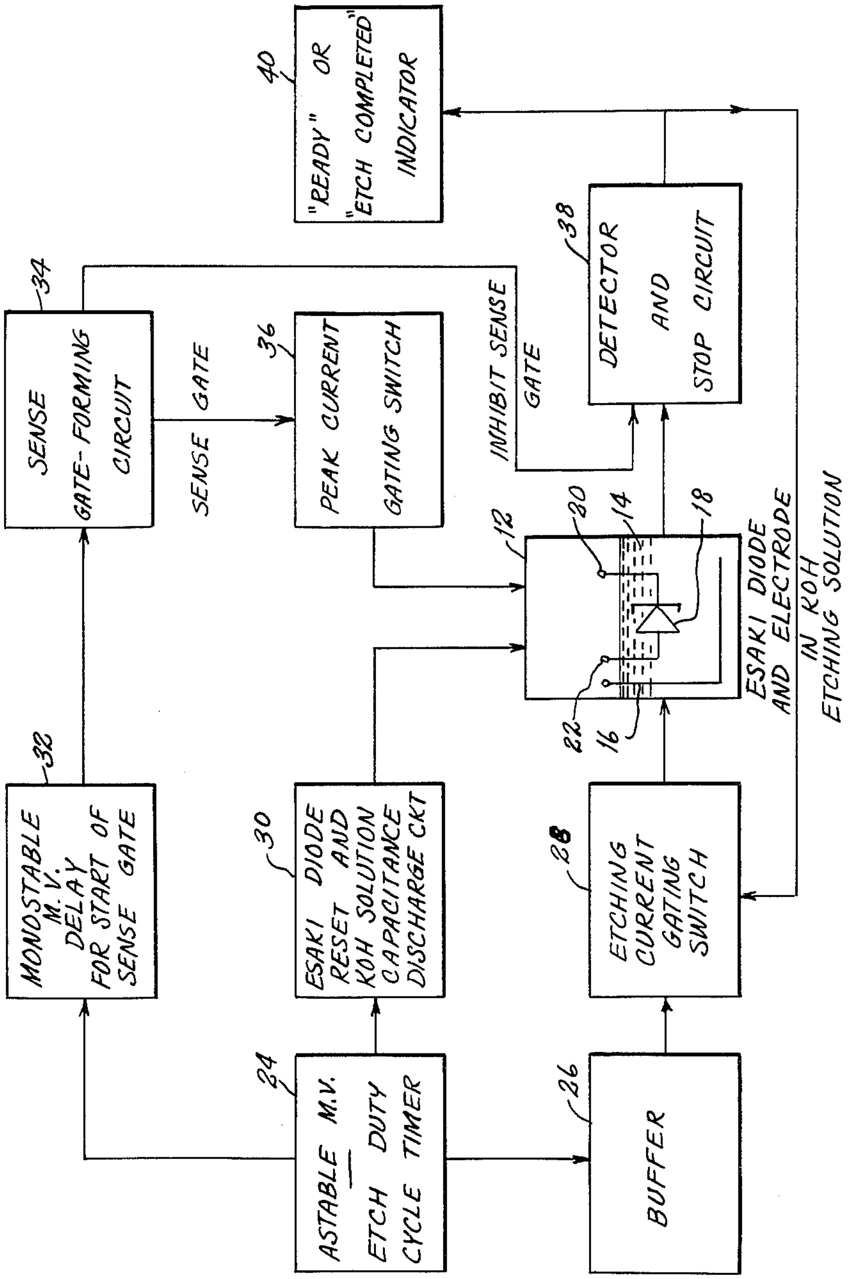

Referring now to FIGURE 1, a container 12 is shown which may be a conventional glass or plastic etching tray for potassium hydroxide electrolytic etching solution. The container 12 is partially filled with potassium hydroxide etching solution 14. Supported in the solution is a raw Esaki diode 18 which is to be etched to obtain a particular desired peak current characteristic. The Esaki diode has terminals 20 and 22. An electrode 16 is provided in the etching solution. Although the particular arrangement of the etching apparatus itself does not form a part of the present invention the container 12 may be of glass or plastic, the etching solution may be 25% potassium hydroxide and the etching electrode may be formed of a platinum strip on a stainless steel or nickel base. The diode may be mounted wtih approximately 3/16 inch spacing between the diode junction and the electrode.

The diode is suitably mounted in the solution by placing the diode in a conventional transistor socket mounted in inverted position over the etching solution and supported by the rim of the container 12. The present invention may be adapted to other etching arrangements and the previously described arrangement is set forth only by way of example.

Apparatus for carrying out the etching operation according to the present invention to obtain a desired peak current characteristic is illustrated in block form in FIGURE 1.

According to the present invention, the etching current is periodically interrupted to determine if the etching process has been carried out sufficiently to provide the desired predetermined peak current characteristic. The basic etching cycle is controlled by a timer 24 which may comprise an astable transistor multi-vibrator.

A buffer amplifier stage 26 may be provided to isolate the timing circuit from the etching current circuit. An etching current gating switch 28 is provided which may also have provision for controlling the magnitude of which would interfere with the peak current characteristic As will later be more fully explained, it is necessary to reset the diode prior to sensing its peak current characteristic. This is accomplished by the Esaki diode reset circuit 30 which also serves to discharge the capacitance represented by the potassium hydroxide solution and electrodes so that there is no substantial stored charge which would interfere with the peak current characteristic sensing operation.

A mono-stable multi-vibrator delay circuit 32 is provided to delay the start of the sensing operation while the Esaki diode is being reset and the etching solution capacitance discharged by circuit 30. The period of the sensing operation is determined by the sense-gate forming circuit 34. An output from circuit 34 turns on the peak current gating switch which causes a current equal to the desired peak current characteristic to flow through the diode 18. The peak current gating switch 36 may also contain provisions for setting the peak current at a desired level.

Another output of the sense-gate forming circuit 34 renders the detector and stop circuit 38 inoperative throughout the portion of the operating cycle when the sensing operation is not being performed i.e. during the etching portion of the cycle and the reset portion of the cycle.

As will later be more fully explained, the detector 38 is arranged to respond when the diode 18 switches from the low voltage portion of its characteristic to the high voltage portion of its characteristic, thereby indicating that the preset peak current supplied by circuit 36 is equal to or greater than the existing peak current characteristic value of the diode. The etching-sensing cycle is repeated sufficiently rapidly with respect to the rate of etching so that the detector and stop circuit 38 responds when the peak current characteristic of the diode reaches the desired level and before any further substantial amount of etching can take place.

An indicator 40 may be provided in the nature of a lamp or other signal to alert an operator to the completion of the process. Regardless of the diligence of the operator or attendant in removing the diode, the etching current is immediately interrupted by the detector and stop circuit 38. Operation of the other circuits may also be discontinued by the detector and stop circuit 38 to the extent that may be desired.

Figure 2:
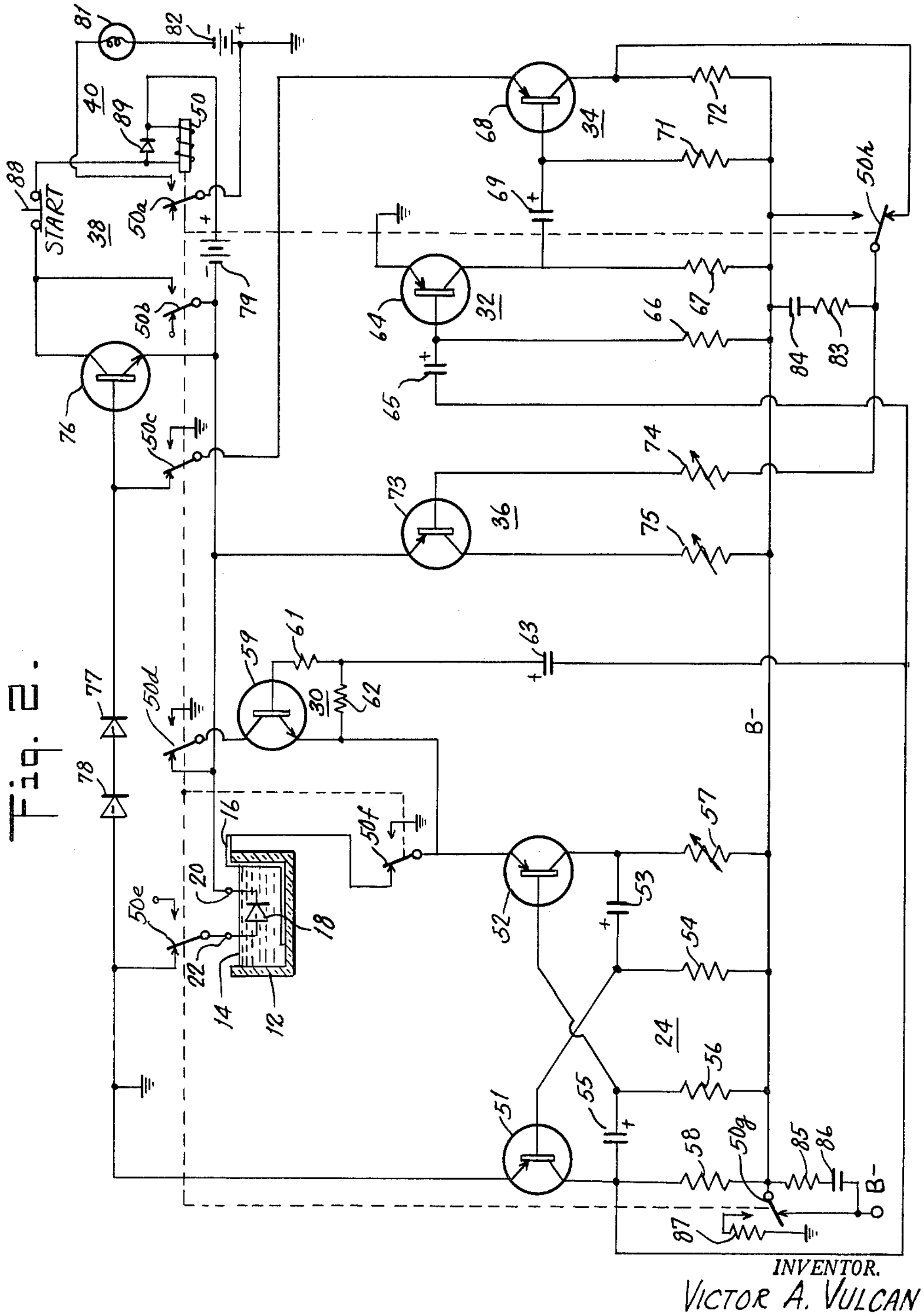
FIG. 2 is a schematic circuit diagram of a basic circuit for apparatus according to the present invention.

FIGURE 2 shows in schematic form a single circuit for controlling the etching of Esaki diodes according to the present invention.

The diode 18 to be processed is mounted in an etching container 12 in the apparatus of FIGURE 2 in a manner similar to that illustrated in FIGURE 1. The etching process is started and stopped by means of a relay 50 having contacts **50*a* through 50*g*** which are shown in FIGURE 2 in the position they would occupy during the processing operation.

Transistors (pnp) 51 and 52 form part of an astable multivibrator circuit which performs the function of the etch duty cycle timer 24 illustrated in FIGURE 1. Transistors 51 and 52 also serve as the etching current gating switch 28 in the circuit of FIGURE 1. Capacitors and resistors 53–58 are connected in circuit with transistors 51 and 52 and perform the following functions. The RC time constant of capacitor 53 and resistor 54 controls the "on" time of transistor 52; the RC time constant of capacitor 55 and resistor 56 controls the "off" time of transistor 52, thus fixing the etching duty cycle. The voltage across the collector-connected resistor 58 of transistor 51 initiates various operations of the system to be performed between etching periods. The multivibrator circuit is sufficiently unbalanced so that it is self-starting. Variable resistor 57 controls the etching rate during the etching process by its control of the emitter current of transistor 52.

Transistor (npn) 59 together with resistors 61 and 62 and capacitor 63 constitutes the Esaki diode reset circuit. Transistor 59 also acts to discharge the substantial charge due to the capacitance of the electrolyte solution. Otherwise the substantially nonconducting state of transistor 52 during the reset cycle would prevent the dissipation of the stored charge. Operation of transistor 59 is controlled by connection of its base electrode through resistor 61, and capacitor 63 to the collector terminal of transistor 51. The voltage across collector resistor 58 is sufficient to drive transistor 59 to saturation and provide a very low impedance path from diode terminal 20 through the collector and emitter terminals of transistor 59 and through relay contact **50*f* to the etching electrode 16. The resulting current level thereby resets diode 18 to its low voltage condition and the stored charge of the electrolytic solution is discharged. Capacitor 63 discharges to the potential of the collector of transistor 51** thus preparing the circuit for the peak current sensing operation.

Sufficient delay for reset and electrolytic discharge is provided by pnp transistor 64 acting in conjunction with transistor 51 to provide a monostable multivibrator to delay the start of the sense gate. Capacitor 65 and resistor 66 connected in the base circuit of transistor 64 determine the delay provided before the start of the sensing operation by their RC time constant.

Transistor (pnp) 68 develops sense gate and inhibit sense gate signals; inhibition of sensing is provided by a signal from transistor 68 supplied through relay contact **50*c* to Esaki diodes 77 and 78** in a manner which will be more fully described hereinafter.

Transistor 68 is switched "off" by the voltage appearing across a resistor 67 connected in the collector circuit of transistor 64 at the end of its delay period. This voltage step is supplied to transistor 68 through a capacitor 69. The RC time constant of capacitor 69 and resistor 71 controls the "off" time of transistor 68 (during which no emitter current flows), which is the width of the sensing gate.

Transistor (pnp) 73 is the gating switch which passes a preselected value of current through diode 18 during the sensing operation. The signal to control transistor 73 is provided by the voltage across collector-connected resistor 72 in the circuit of transistor 68. As long as transistor 68 conducts, negligible base current flows in transistor 73. As transistor 68 turns off and the current through collector resistor 72 drops to a low value, the collector potential of transistor 68 drops toward the negative supply voltage (B−) and thus turns on transistor 73 by returning the base of transistor 73 substantially to B− potential through resistor 72, relay contact 50*h*, and resistor 74. At the end of the sense gate, the sequence just described is reversed and the base current of transistor 73 is cut "off". During the sensing operation the sensing current is controlled primarily by variable resistors 74 and 75. As previously explained these resistors will be set to provide a current through diode 18 substantially equal to the peak current characteristic which it is desired that the diode have.

To recapitulate the operation of the system thus far described; the overall timing cycle is determined by transistors 51 and 52, transistor 52 also operating as a gate to control the flow of etching current through diode 18 during the etching portion of the cycle. The collector potential of transistor 51 controls the reset circuit comprising transistor 59 to initiate the reset action immediately following the end of the etching portion of the cycle. Sufficient time for the reset operation is provided by the sense gate relay circuit 32 comprising transistor 64. After the delay provided by transistor 64, transistor 68 operates for a predetermined time interval to control the sensing period of the cycle. The flow of sensing current is controlled by transistor 73 in conjunction with variable resistors 74 and 75.

There now remains to be described the detector portion of the circuit which senses when the desired peak current characteristic has been achieved and terminates the etching operation. Transistor 76 is the central element of the detector circuit.

Provision is made for disabling the transistor 76 during the etching portion of the cycle so that an erroneous "etch completed" determination will be avoided. This is accomplished by reverse biasing the emitter-to-base junction of transistor 76. Two germanium Esaki diodes 77 and 78 of a type similar to that processed by the system are inserted in the base circuit of transistor 76. The emitter current of transistor 68 flows through diodes 77 and 78 and is greater than the peak current characteristic of either diode 77 or 78. Thus when the full emitter current from transistor 68 is flowing through diodes 77 and 78 they will be switched from the low voltage portion of their characteristic to the high voltage portion of their characteristic. The combined voltage drop across diodes 77 and 78 while operating in the high voltage portion of their characteristic is sufficient to cut off transistor 76 and thus render the detector circuit inoperative for all but the sensing portion of the operating cycle. During the sensing portion of the cycle, however, the current flow through diodes 77 and 78 will be sufficiently low to prevent diodes 77 and 78 from operating on the high voltage portion of their characteristic curves and the diodes will represent for all practical purposes a short circuit. A single gallium arsenide tunnel diode may be utilized in place of the pair of diodes 77 and 78 to achieve substantially the same result.

The particular gate circuit provided by Esaki diodes 77 and 78 is very advantageous in the apparatus herein described and also may be found to have advantages in quite diverse types of control circuits and computer circuits. The advantages of the use of the Esaki diode gate circuit will be understood from the fact that a very useful dual value of total gate resistance is obtained. The gate resistance is about 20 to 25 ohms when the series pair of diodes 77–78 is conducting in the "high" voltage state, but is only 2 to 2.5 ohms for low values of current not exceeding the lowest peak current characteristic of the pair. The advantage derived from this quality in the present circuit enables the base-emitter junction of transistor 76 to be effectively in shunt with the tunnel diode 18 whenever the inhibit gate current is not flowing through diodes 77 and 78. The nonlinear resistance of diode 18 connected in shunt with the base-emitter junction of transistor 76 presents a low voltage drop across the emitter and base terminals of transistor 76 so long as the sensing current provided by transistor 73 is less than the instantaneous peak current characteristic of diode 18. As the etching progresses, however, and the peak current characteristic of diode 18 is lowered, it eventually becomes less than the value of current supplied by transistor 73. At this time the diode 18 switches to the high voltage portion of its characteristic thereby producing a potential across the emitter-base terminals of the npn transistor 76 sufficient to switch transistor 76 to its conducting state.

The winding of relay 50 is connected in series with relay voltage supply 79 across the emitter and collector terminals of diode 76. Thus, when the transistor 76 conducts, relay 50 is operated. Diode 89 protects transistor 76 from voltage spikes upon depression of start button 88.

The contacts of the relay 50 perform the following functions when the etching has progressed to the point where the desired peak current characteristic has been obtained:

Relay contact 50*a* completes the circuit of an indicator lamp 81 and indicator lamp power supply 82.

Relay contact 50*b* closes the circuit of the winding of relay 50 independently of transistor 76 thereby latching relay 50.

Relay contacts 50*c*, 50*d* and 50*f* connect the respective emitters of transistors 68 and 52 to ground and open connections to the emitter and base of transistor 76, thereby preventing back voltages on transistor 76 during the relay "operate" response time.

Relay contact 50*e* opens the etching circuit of diode 18, causing all emitter current of transistor 73 to flow through diodes 77 and 78 and the base of transistor 76.

Contact 50*g* switches the supply voltage B− to ground potential slowly enough so that the relay 50 will latch before the input current to transistor 76 cuts off thereby preventing chattering of the relay.

Relay contact 50*h* returns the base resistor 74 of transistor 73 to B− potential, to prevent premature cessation of input base current to transistor 76 during response time of relay 50.

Capacitor 84 and resistor 83 shunted across contact 50*h* and B− power supply serve to moderate the transition when contact 50*h* goes from normal to operated condition.

Gradual cut-off of the B− power supply by relay contact 50*g* is assured by resistors 85 and 87 and capacitor 86.

The maximum peak current characteristic for which the apparatus of FIGURE 2 may be set is limited by the peak current characteristics of diodes 78 and 77 which may be selected to have high peak current characteristic values, and by the maximum allowable base dissipation of transistor 76 at the highest expected operating ambient temperature.

From the foregoing explanation, it will be seen that the apparatus of FIGURE 2 cyclically etches and senses the diode 18 until such time as a predetermined value of peak current characteristic has been provided in diode 18 at which time the detector circuit automatically discontinues the etching operation, causes an indicator lamp to be lit and shuts off the power to selected portions of the apparatus.

Details of the detector circuit operation may be understood by reference to FIGURE 5 in which dashed line A is the graph of the voltage-current characteristic of a raw Esaki diode to be processed. A desired peak current characteristic is established by adjusting the sensing current to the level $I_{sense}$ indicated by horizontal line G. After the etching process commences the characteristic of the diode will be altered until it assumes the form shown by solid line B during which time the original peak current characteristic D′ will be reduced to D. When the peak current characteristic D no longer exceeds the sensing current, the diode will switch through the negative resistance portion of C of its characteristic to some point in the high voltage portion determined by the intersection of the (detector) load line E with the instantaneous characteristic curve B. It will be understood that the diode must be reset from the etching operating point at F to some low voltage portion of its characteristic (lower than peak current voltage) before commencement of the sensing operation.

While the circuit of FIGURE 2 is fully effective for the practice of the invention, and is relatively simple and thus provides a convenient basis for explanation, certain refinements are desirable in practical apparatus.

Figure 3:
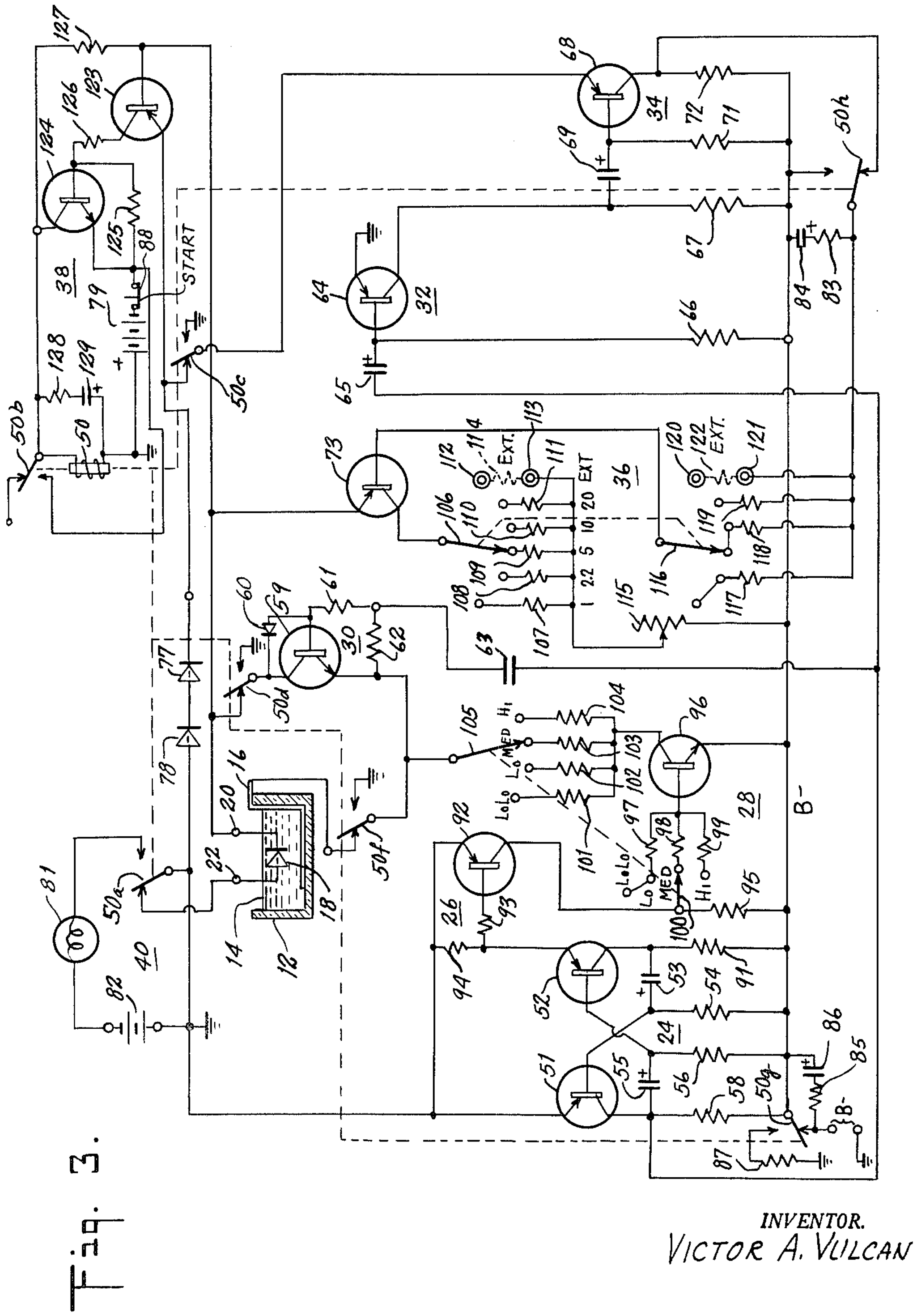
FIG. 3 is a schematic circuit diagram of an alternate circuit embodying certain further practical design features for etching Esaki diodes according to the present invention.

Such refinements are illustrated in FIGURE 3. The operation of the circuit of FIGURE 3 is generally similar to that described with respect to FIGURE 2 except for the following refinements.

The use of a single transistor 52 in the circuit of FIGURE 2 both as a part of the multivibrator and as the etching current gate results in an interaction between the etching current control and the etch duty cycle and other portions of the timing cycle of the apparatus.

This interaction has been substantially eliminated in the circuit of FIGURE 3. Variable resistor 57 is replaced with a fixed resistor 91. A separate pnp transistor 92 is provided as a buffer stage between the etch duty cycle timer 24 and the etching current gating switch circuit 28 which now comprises additional n-p-n transistor 96. Buffer stage 26 comprises, in addition to transistor 92, resistors 93 and 94. The collector of transistor 92 is connected through resistor 95 to the B— power supply and the voltage appearing across resistor 95 provides the input signal to the base of transistor 96 in the etching current gating switch circuit.

Alternatively selectable base resistors 97, 98 and 99 are provided for transistor 96 and are alternatively switched into circuit with transistor 96 by switch contact arm 100 which forms a part of the etching current control. The etching current selector switch switches into position the proper one of resistors 97, 98 and 99 to maintain the circuit gain of transistor 96 low enough for saturation conditions to prevail at each respective etching current. Alternatively selectable resistors 101, 102, 103 and 104 are arranged in the collector circuit of transistor 96 to control the collector current of transistor 96, which is the etching current supplied to each diode 18. Contact arm 105 for selecting among resistors 101–104 is ganged with contact arm 100.

In the specific circuit shown, one of four levels of etching current may be selected, namely 100 milliamps, designated low-low; 150 milliamps, designated low; 250 milliamps, designated medium; or 350 milliamps, designated high.

In the circuit of FIG. 3 the controls for determing the target peak current characteristic have been made somewhat more refined to allow them to be operated by other than technically trained operators simply by selecting a switch position. Accordingly variable resistors 74 and 75 (of FIGURE 2) have been replaced by respective groups of alternatively selectable fixed resistances. In the collector circuit of transistor 73, switch contact arm 106 may be oriented to place either of resistors 107, 108, 109, 110 and 111 in the collector circuit. These resistors are respectively associated with switch positions for peak current characteristics of 1, 2.2, 5, 10, and 20 milliamps.

A further "external" position is provided whereby a resistor 114 having any desired value of resistance may be connected between accessible terminals 112 and 113 to provide a desired collector circuit resistance, a trimming resistor 115 is provided in series with the collector circuit for fine adjustment.

In the base circuit of transistor 73 a further movable contact arm 116 is provided for connecting suitable base resistances 117, 118 or 119 in circuit with transistor 73 correlated with the collector resistance selected by contact arm 106. Contact arms 106 and 116 are ganged together and may comprise decks of a multiple deck switch. Accessible terminals 120 and 121 are provided for the connection of an external base resistance 122 if desired. Provision for external collector and base resistance 114 and 122 allows any desired intermediate value of peak current characteristic to be obtained in addition to the preset values indicated in FIGURE 3.

Where high discharge currents from electrolyte 14 are encountered, diode 60 connected in parallel with transistor 59 may be provided, as shown in FIGURE 3, to assure proper discharge of electrolyte 14 within the reset period.

The apparatus of FIGURE 3 also differs from that of FIGURE 2 in that a common ground is supplied for all circuits. Accordingly a pnp transistor 123 is utilized as the detector transistor and diodes 77 and 78 are connected in the emitter branch of the circuit rather than in the base branch as was the case in FIGURE 2. A second stage of the detector is provided by an n-p-n transistor 124 which, together with resistors 125, 126 and 127, forms the remainder of the detection circuit represented by the circuit of transistor 76 in FIGURE 2.

Transistor 124 is driven by the output of transistor 123 and the output of transistor 124 controls relay 50. The winding of relay 50 is shunted by a resistor 128 and capacitance 129. These elements reduce transients which might damage transistor 124 and preserve the timing relationship in the circuit. Proper timing is also maintained by resistor 127 which helps keep transistor 123 conducting, when fired, until the relay can latch, thereby preventing chattering. Theoretical maximum sensing current which can be handled by the two-stage detector on FIGURE 3 is 32.5 milliamps, or allowing for some margin of safety, 30 milliamps. It may be noted that in FIGURE 3 the switch contact 50*a* performs the function both of switch contact 50*a* and switch 50*e* in FIGURE 2.

In the table immediately following, the characteristics of circuit elements of FIGURE 3 are given by way of illustration; it will be appreciated that the scope of the invention is not limited to the particular characteristics of circuit elements nor, in fact, to specific features of the electrical circuit, but that the values are given solely for the purpose of illustration.

*Table I*

| Element: | Value or Type |
|---|---|
| **50** | T154-cc-cc (two in parallel). |
| **51, 52** | 2N316A. |
| **53** | 50. |
| **54** | 12K. |
| **55** | 150. |
| **56** | 5.1K. |
| **58** | 27K. |
| **59** | 2N447A. |
| **60** | 2N444A-connected as two diodes in parallel with emitter and collector tied together. |
| **61** | 1.2K. |
| **62** | 10K. |
| **63** | 40. |

| | |
|---|---|
| **64** | 2N316A. |
| **65** | 12. |
| **66** | 27K. |
| **67** | 1.8K. |
| **68** | 2N316A. |
| **69** | 40. |
| **71** | 5.6K. |
| **72** | 330–1W. |
| **73** | 2N1026A. |
| **77, 78** | Ge Esaki Diodes Ip=40 ma.±10%. |
| **79** | 24 v. |
| **81** | 47. |
| **82** | 6 v. |
| **83** | 560. |
| **84** | 2. |
| **85** | 560. |
| **86** | 2. |
| **87** | 56K. |
| **91** | 330–1W. |
| **92** | 2N316A. |
| **93** | 330. |
| **94** | 33. |
| **95** | 1K–1W. |
| **96** | 2N358A (heat sink). |
| **97** | 2.2K. |
| **98** | 1.2K. |
| **99** | 750. |
| **101** | 160–2W. |
| **102** | 100–3W. |
| **103** | 56–5W. |
| **104** | 33–6W. |
| **107** | 28.7K–1%. |
| **108** | 8K–1%. |
| **109** | 3.5K–1%. |
| **110** | 910–1%. |
| **111** | 70–1%. |
| **115** | 10 turn–2K–"Helipot." |
| **117** | 50K–1%. |
| **118** | 15K–1%. |
| **119** | 3K–1%. |
| **123** | 2N316A. |
| **124** | 2N357A. |
| **125** | 470. |
| **126** | 6.8K. |
| **127** | 47K. |
| **128** | 560. |
| **129** | 2. |

(1) Resistance values in ohms with tolerance 5%, power one-half watt unless otherwise indicated.

(2) Capacitance values in microfarads, tolerance 10%.

(3) All transistors General Transistor type except 2N1026A–Si manufactured by Sperry.

Figure 4:
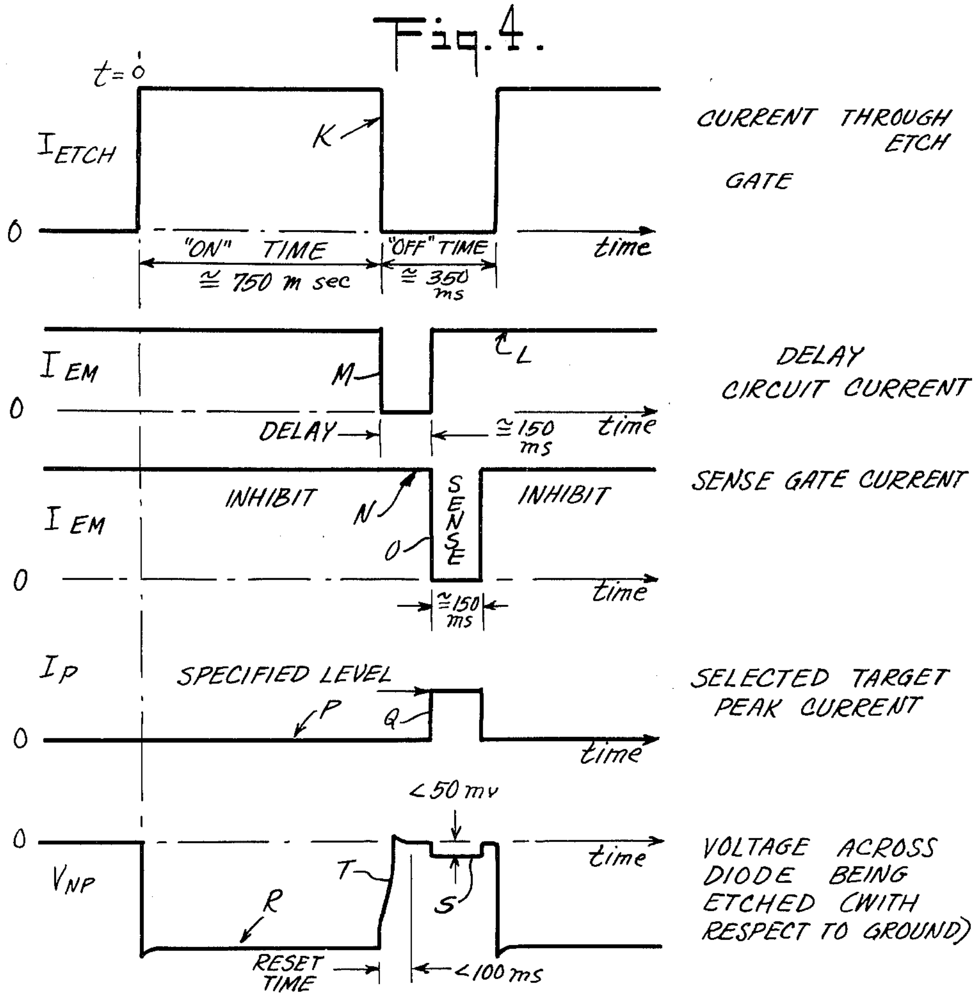
FIG. 4 is a series of wave form diagrams presented to aid in the explanation of operation of circuits according to the present invention.

A typical operating cycle of the apparatus (for example the embodiment of FIGURE 3) is illustrated by the waveform diagrams of FIGURE 4.

Waveform K shows the basic etch cycle of approximately 750 msec. "on" and 350 msec. "off." Waveform L shows the delay circuit current pulse M of approximately 150 msec.

Waveform N shows the sense gate pulse of approximately 150 msec. duration. Waveform P shows the sensing current pulse Q, and Waveform R shows the voltage across diode 18 with reset pulse T and the voltage S which is sensed to detect arrival at the target peak current characteristic.

It will be appreciated that numerous variations may be devised to the specific circuits illustrated by those of skill in the art by substitution of well known sub-circuits (which need not be limited to transistor circuits) or otherwise.

It may be noted that an installation for the controlled etching of Esaki diodes in accordance with the present invention may normally include numerous etching stations and that certain subcomponents of the circuit need not be duplicated at each etching station but may be arranged to serve as control circuit for several stations. For example, any one or more of the etch duty cycle timer circuit 24, buffer circuit 26, or delay circuit 32 may be utilized as a common circuit for more than one etching station.

The apparatus and method of the present invention may also be adapted to situations and operations other than that particularly described by way of illustration and in any use the method and apparatus is susceptible of numerous modifications and variations by those skilled in the art without exceeding the scope of the present invention. Accordingly it is desired that the scope of the invention not be limited to the particular embodiments described or suggested, but that it be limited solely by the appended claims.

What is claimed is:

1. The process for controllably etching Esaki diodes to establish within a predetermined tolerance a desired value of peak current characteristic for said diodes comprising the steps of supporting an Esaki diode in an electrolytic solution, supplying a current through said diode to cause etching of said diode, cyclically interrupting said current for a given period of time and, while said etching current is interrupted, supplying a reset signal to said diode of a magnitude such as to cause said diode to be switched to a preselected portion of its voltage-current characteristic other than that which obtains prior to the supplying of said reset signal, thereafter supplying a sensing current through said diode, said sensing current being applied to said diode during the interruption of said etching current, evaluating the voltage across said diode, detecting a value of said voltage in a predetermined portion of said diode characteristic, and discontinuing said etching current in response thereto.

2. The process for controllably etching Esaki diodes to establish within a predetermined tolerance a desired value of peak characteristic for said diodes comprising the steps of supporting an Esaki diode in an electrolytic solution, supplying a current through said diode to cause etching of said diode, cyclically interrupting said current for a given period of time and, while said etching current is interrupted, supplying a reset signal to said diode of a magnitude such as to cause said diode to be switched to a preselected portion of its voltage-current characteristic other than that which obtains prior to the supplying of said reset signal, thereafter supplying a sensing current through said diode, said sensing current being applied to said diode during the interruption of said etching current, evaluating the voltage across said diode, detecting a value of said voltage in a predetermined portion of said diode characteristic, and discontinuing said etching current in response thereto.

3. The process for controllably etching Esaki diodes to establish within a predetermined tolerance a desired value of peak current characteristic for said diodes comprising the steps of supporting an Esaki diode in an electrolytic solution, supplying a current through said diode to cause etching of said diode, cyclically interrupting said current for a given period of time and, while said etching current is interrupted, supplying a reset signal to said diode of a magnitude such as to cause said diode to be switched to the low voltage portion of its voltage-current characteristic, thereafter supplying a sensing current through said diode, said sensing current being applied to said diode during the interruption of said etching current, evaluating the voltage across said diode, detecting a value of said voltage in the high voltage portion of said diode characteristic, and discontinuing said etching current in response thereto.

4. The process for controllably etching Esaki diodes to establish within a predetermined tolerance a desired value of peak current characteristic for said diodes comprising the steps of supporting an Esaki diode in an electrolytic solution, supplying a current through said diode to cause etching of said diode, cyclically interrupting said current for a given period of time and, while said etching current is interrupted, supplying a reset signal to said diode of a magnitude such as to cause said diode to be switched to the low voltage portion of its voltage-current characteristic and discharging said electrolytic solution, thereafter supplying a sensing current through said diode, said sensing current being applied to said diode during the interruption of said etching current, evaluating the voltage across said diode, detecting a value of said voltage in the high voltage portion of said diode characteristic, and discontinuing said etching current in response thereto.

5. The process for controllably etching Esaki diodes to establish within a predetermined tolerance a desired value of peak current characteristic for said diodes comprising the steps of supporting an Esaki diode in an electrolytic solution, supplying a current through said diode to cause etching of said diode, cyclically interrupting said current for a given period of time and, while said etching current is interrupted, supplying a reset signal to said diode of a magnitude such as to cause said diode to be switched to the low voltage portion of its voltage-current characteristic, thereafter supplying a sensing current through said diode having a magnitude substantially equal to the desired peak current characteristic, said sensing current being applied to said diode during the interruption of said etching current, evaluating the voltage across said diode, detecting a value of said voltage in the high voltage portion of said diode characteristic, and discontinuing said etching current in response thereto.

6. The process for controllably etching Esaki diodes to establish within a predetermined tolerance a desired value of peak current characteristic for said diodes comprising the steps of supporting an Esaki diode in an electrolytic solution, supplying a current through said diode to cause etching of said diode, cyclically interrupting said current for a given period of time and, while said etching current is interrupted, supplying a reset signal to said diode of a magnitude such as to cause said diode to be switched to the low voltage portion of its voltage-current characteristic and discharging said electrolytic solution, thereafter supplying a sensing current through said diode having a magnitude substantially equal to the desired peak current characteristic, said sensing current being applied to said diode during the interruption of said etching current, evaluating the voltage across said diode, detecting a value of said voltage in the high voltage portion of said diode characteristic, and discontinuing said etching current in response thereto.

7. Apparatus for controllably etching Esaki diodes to establish a desired value of peak current characteristic for said diodes comprising a container for electrolytic solution, means for supporting an Esaki diode in said solution, an electrode in said solution, means for establishing electrical connections to said diode, means for supplying a current through said electrode, said electrolytic solution and said diode to cause etching of said diode, means for cyclically interrupting said current, means for supplying a sensing current through said diode having a magnitude substantially equal to the desired peak current characteristic, means for supplying a reset signal to said diode and for discharging said electrolytic solution, said reset signal being of a magnitude causing said diode to be switched to the low voltage portion of its voltage-current characteristic, means for causing first said reset signal and discharging means and then said sensing current to be sequentially applied to said diode during the interruption of said etching current, means for evaluating the voltage across said diode, means for disabling the last said means during the flow of said etching current, means for detecting a value of voltage in the high voltage portion of said diode characteristic and means for discontinuing said etching current in response to the last said means.

References Cited by the Examiner

UNITED STATES PATENTS

| | | | |
|---|---|---|---|
| 2,827,427 | 3/1958 | Barry | 204—143 |
| 2,846,346 | 8/1958 | Bradley | 204—143 |
| 2,913,383 | 11/1959 | Topfer | 204—143 |
| 2,970,227 | 1/1961 | Horton | 307—88.5 |
| 2,979,444 | 4/1961 | Tiley | 204—143 |
| 2,982,868 | 5/1961 | Emile | 307—88.5 |
| 3,023,153 | 2/1962 | Kurshan | 204—143 |
| 3,075,902 | 1/1963 | Bradley et al. | 204—143 |
| 3,085,055 | 4/1963 | Bradley | 204—143 |

JOHN H. MACK, *Primary Examiner.*

P. SULLIVAN, *Examiner.*

R. L. GOOCH, R. K. MIHALEK, *Assistant Examiners.*